US009846277B1

(12) United States Patent
Hu et al.

(10) Patent No.: US 9,846,277 B1
(45) Date of Patent: Dec. 19, 2017

(54) SEMICONDUCTOR DEVICES

(71) Applicant: HEWLETT PACKARD ENTERPRISE DEVELOPMENT LP, Houston, TX (US)

(72) Inventors: Yingtao Hu, Palo Alto, CA (US); Di Liang, Santa Barbara, CA (US); Raymond G Beausoleil, Seattle, WA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/222,922

(22) Filed: Jul. 28, 2016

(51) Int. Cl.
*G02B 6/00* (2006.01)
*G02B 6/122* (2006.01)

(52) U.S. Cl.
CPC .................................. *G02B 6/122* (2013.01)

(58) Field of Classification Search
CPC ....................................................... G02B 6/122
See application file for complete search history.

(56) References Cited

U.S. PATENT DOCUMENTS

| 4,011,583 | A | * | 3/1977 | Levinstein | ........ | H01L 21/28575 |
| | | | | | | 148/DIG. 18 |
| 5,045,502 | A | * | 9/1991 | Lau | ................... | H01L 21/28575 |
| | | | | | | 257/745 |
| 5,480,829 | A | * | 1/1996 | Abrokwah | .......... | H01L 27/0605 |
| | | | | | | 257/E21.407 |
| 7,285,857 | B2 | * | 10/2007 | Kwak | ............... | H01L 21/28575 |
| | | | | | | 257/745 |
| 7,420,227 | B2 | * | 9/2008 | Chang | ................... | H01L 29/452 |
| | | | | | | 257/197 |
| 8,466,555 | B2 | | 6/2013 | Chelakara et al. | | |
| 8,753,918 | B2 | | 6/2014 | Varghese et al. | | |
| 9,252,118 | B2 | | 2/2016 | Jain et al. | | |
| 2014/0346568 | A1 | | 11/2014 | De Jaeger et al. | | |

FOREIGN PATENT DOCUMENTS

JP           5326928 B2      10/2013

OTHER PUBLICATIONS

Chin, H-C., "In Situ Surface Passivation and CMOS-Compatible Palladium-Germanium Contacts for Surface Channel Gallium Arsenide MOSFETs," (Research Paper), Electron Device Letters, IEEE 29.6, Jun. 2008, pp. 553-556. available at http://ieeexplore.ieee.org/xpl/articleDetails.jsp?arnumber=4528758&queryText=German%20palladium%20gold%20free&newsearch=true.
Liu, X., "High voltage AlGaN/GaN metal-oxide-semiconductor high-electron mobility transistors with regrown In0.14Ga0.86N contact using a CMOS compatible gold-free process," (Research Paper), Applied Physics Express 7.12, Dec. 3, 2014, 3 pages, available at http://iopscience.iop.org/article/10.7567/APEX.7.126501/pdf.

* cited by examiner

*Primary Examiner* — Sung Pak
(74) *Attorney, Agent, or Firm* — Hewlett Packard Enterprise Patent Department

(57) ABSTRACT

Examples herein relate to semiconductor devices having contacts that provide low contact resistance for both p-type and n-type materials. An example semiconductor device includes a semiconductor device layer having at least one of a p-type material or a n-type material. A contact is manufactured on the semiconductor device layer with a complementary metal-oxide-semiconductor process. The contact includes a first layer having palladium coupled with a surface of the semiconductor device layer, a conducting second layer coupled with the first layer, and a third layer having germanium coupled with the second conducting layer.

13 Claims, 3 Drawing Sheets

SEMICONDUCTOR DEVICES

STATEMENT OF GOVERNMENT INTEREST

This invention has been made with government support under Contract No. H98230-12-C-0236 awarded by Maryland Procurement Office. The government has certain rights in the invention.

BACKGROUND

Optical communication is becoming more prevalent in computer systems and network communications. Optical signals can propagate in a variety of different media, such as optical waveguides, between different computer systems and network devices. Modern Integrated Circuits (ICs) designed to facilitate optical devices have a profound impact on computing, electronics, and photonics.

BRIEF DESCRIPTION OF THE DRAWINGS

The following detailed description references the drawings, wherein.

DETAILED DESCRIPTION

Integrated circuits include contacts to provide electrical connectivity to operate the integrated circuit devices. The contacts are typically made of metal with high conductivity, such as copper, aluminum, or gold. Copper and aluminum are frequently used in silicon-based circuits, whereas noble metals such as gold are commonly used in circuits based on compound semiconductors such as III-V materials. Copper and aluminum generally do not form low-resistance contacts with III-V materials as well as gold.

Compound semiconductors have become prevalent in photonic technologies, and ICs designed to facilitate optical devices have become a strong area of interest. However, gold may be a contaminant in CMOS fabrication environments. CMOS processing may involve silicon wafer processing. Gold may be prone to diffuse into silicon, allowing electrons to interfere with semiconductor band gaps. This may result in contamination of the resulting IC structure. Thus, gold presents challenges for current equipment used in large-scale CMOS processing, such as fabrication. Yet, other materials compatible with existing CMOS processes may not possess the high conductivity of gold.

Examples disclosed herein address these technical challenges by providing for semiconductor devices with gold-free contacts that provide low contact resistance for both p-type and n-type materials. Example semiconductor devices may include a semiconductor device layer having at least one of a p-type material or an n-type material. A contact may be manufactured on the semiconductor device layer with a complementary metal-oxide-semiconductor process. The contact may include a first layer having palladium coupled with a surface of the semiconductor device layer, a conducting second layer coupled with the first layer, and a third layer having germanium coupled with the second conducting first layer. The palladium and germanium of the first and third layers provide for good adherence to various parts of an IC, including oxide materials (e.g., $SiO_2$), p-type materials (e.g., p-InGaAs), and n-type materials (e.g., n-InP). Accordingly, the metallurgy disclosed herein provide for a contact that does not include gold and is compatible with mass-production CMOS techniques. As a result, examples disclosed herein may simply device fabrication and reduce manufacturing cost, particularly for hybrid III-V-on-silicon photonic devices in a CMOS-compatible environment.

Figure 1:
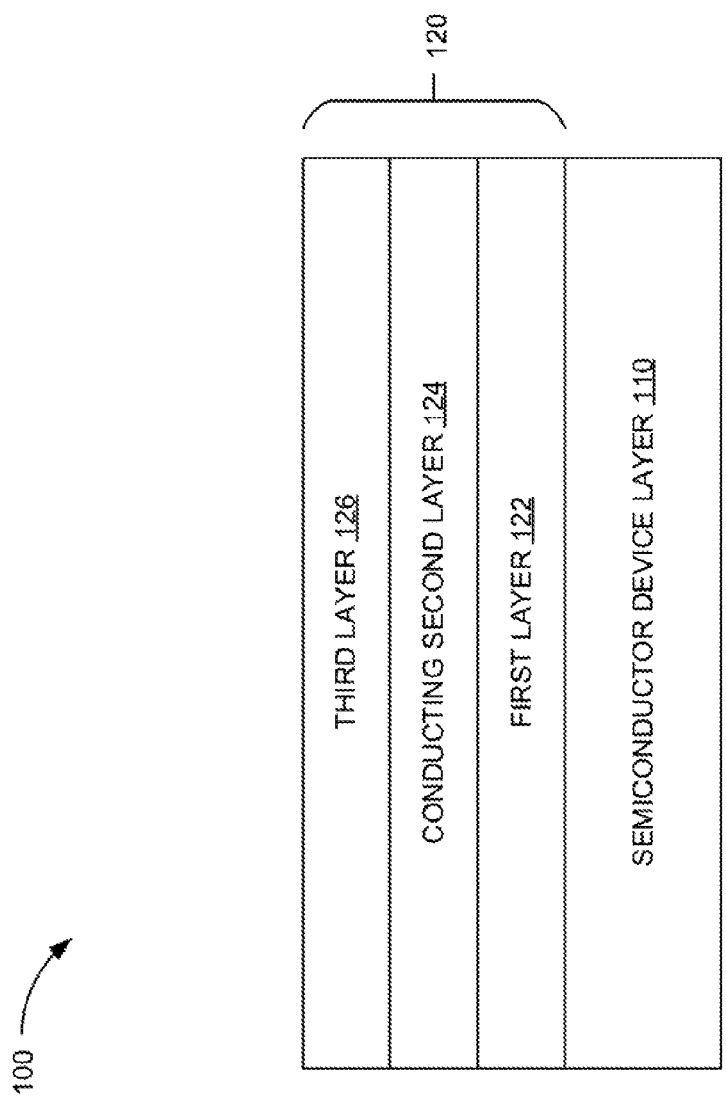
FIG. 1 is a conceptual cross-sectional view of an example semiconductor device having a contact that provides low contact resistance for both p-type and n-type materials.

Referring now to the drawings, FIG. 1 illustrates a conceptual cross-sectional view of an example semiconductor device 100 having a contact that provides low contact resistance for both p-type and n-type materials. Semiconductor device 100 may have a semiconductor device layer 110 and a contact 120 manufactured on the semiconductor device layer 110 with a complementary metal-oxide-semiconductor (CMOS) process. The semiconductor device layer 110 may include a p-type material, an n-type material, or both. Contact 120 may include a first layer 122 coupled with a surface of the semiconductor layer, a conducting second layer 124 coupled with the first layer, and a third layer 126 coupled with the conducting second layer 124. First layer 122 may have palladium, and third layer 124 may have germanium. Semiconductor device 100 may be a device or system that can be implemented in a variety of computer or network systems, including optical computing and communications. For example, semiconductor device 100 may represent a hybrid laser device or any other type of integrated circuit.

Semiconductor device layer 110 may be an active structure of semiconductor device 100. In some examples, semiconductor device 110 may include a substrate which may be a wafer or solid substance onto which other substances are adhered. This substrate may be a discrete layer within semiconductor device layer 110, which may have multiple layers. The substrate may serve as a foundation for microelectronic and photonic devices, and may be the base that electronic and photonic devices are deposited. The substrate may, in some examples, be a thin slice of material, which may include semiconductors such as silicon and germanium, compound semiconductors such as gallium arsenide (GaAs) and indium phosphide (InP), or dielectric insulators such as silicon oxide and aluminum oxide. In some examples, the substrate may include multiple materials, including but not limited to the examples listed above.

In some examples, semiconductor device layer 110 may include a p-type material, an n-type material, or both. A p-type material may be a semiconductor material that has been doped with a material to increase free positive charge carriers (holes). An example of a p-type material may be doped p-InGaAs. An n-type material may be a semiconductor material that has been doped with a material to increase free negative charge carriers (electrons). An example of an n-type material may be doped n-In P.

Furthermore, in some examples, semiconductor device layer 110 may have a base layer and a dielectric layer. In such instances, various layers within semiconductor device layer 110 may represent a semiconductor-on-insulator substrate, such as silicon-on-insulator (SOI). Dielectric materials, such as oxides, may be present in semiconductor device layer 110 to affect the configuration of the layer. As a specific example, a waveguide region of a III-V semiconductor material may be manufactured onto a silicon substrate with a CMOS process. Furthermore, semiconductor device layer 110 may provide various functions for the semiconductor device 100, including optical signal production, modulation, absorption, transport, etc. Additionally or as an alternative, semiconductor device layer 110 may behave as an electronic device such as a high speed transistor.

Contact 120 may be manufactured on the semiconductor device layer 110 with a CMOS process. Contact 120 may provide good adherence to both p-type materials, n-type materials, and, in some examples, to other materials such as oxides. Thus, contact 120 may serve as an electrical control terminal to control operations of the circuit of semiconductor device 100. Contact 120 may include a plurality of layers of different materials and may have a range of thickness. For some examples, contact 120 may have a thickness greater than 100 nanometers. It should be noted that the thickness of the contact 120 and its layers may be based on practical limitations of deposition and other fabrication techniques. However, different thicknesses may be possible to the extent that processing techniques are improved.

Contact 120 may include a first layer 122 coupled with a surface of the semiconductor device layer 110. First layer 122 may be conducting or highly conducting, and may be chemically inert to the surface of the semiconductor device layer 110 to which first layer 122 is coupled. First layer 122 may generally be a thin layer, but may have a range of thicknesses. For example, first layer 122 may range from several nanometers to several tens of nanometers. As a specific example, first layer 122 may have a thickness of about 10 nanometers. First layer 122 may have a highly conducting material such as palladium. In some other examples, first layer 122 may include germanium.

A conducting second layer 124 may be coupled with the first layer 122. Conducting second layer 124 may be chemically inert to the first layer 122, and generally may be a thin layer. Conducting second layer 124 may have a range of thicknesses, such as from several nanometers to tens of nanometers. In one example, conducting second layer 124 may have a thickness of about 10 nanometers. Conducting second layer 124 may be highly conductive and may reduce the overall contact resistivity of the contact 120. For example, a contact with a conducting second layer may have a lower contact resistance than an equivalent contact without the conducting second layer. Conducting second layer 124 may include a CMOS-compatible material, such as a highly conducting metal like titanium.

A third layer 126 may be coupled with the conducting second layer 124. Third layer 126 may be conducting or highly conducting, and may be chemically inert to the conducting second layer 124. Third layer 126 may generally be a thin layer, but may have a range of thicknesses. For example, third layer 126 may range from several nanometers to hundreds of nanometers. As a specific example, third layer 126 may have a thickness of about 60 nanometers. Third layer 126 may a highly conducting material such as germanium. In some other examples, third layer 126 may include palladium.

Continuing to refer to FIG. 1, the contact 120 may include additional layers, including a highly conductive fourth layer coupled with the third layer 126, a diffusion blocking layer coupled with the fourth layer, and/or a probing layer coupled with the diffusion blocking layer. Additional details of these additional layers are described in detail herein with reference to FIG. 2.

The contact 120 and its layers may be manufactured on semiconductor using a CMOS process. For example, each of the layers may be deposited by sputtering and/or evaporation. In some examples, the process to manufacture the contact 120 may include a dry-etch technique to form various shapes and designs. Furthermore in some examples, the contact 120 and its layers may be annealed after deposition. For example, the contact 120 may be annealed at 400° C. for 30 seconds (or other temperature and time combinations based on size and dimension).

As described previously, the contact 120 may provide low contact resistance for both p-type and n-type materials. For example, the contact 120 may provide contact resistivity equal to or less than $3\times10^{-5}$ Ohm-cm$^2$.

Figure 2:
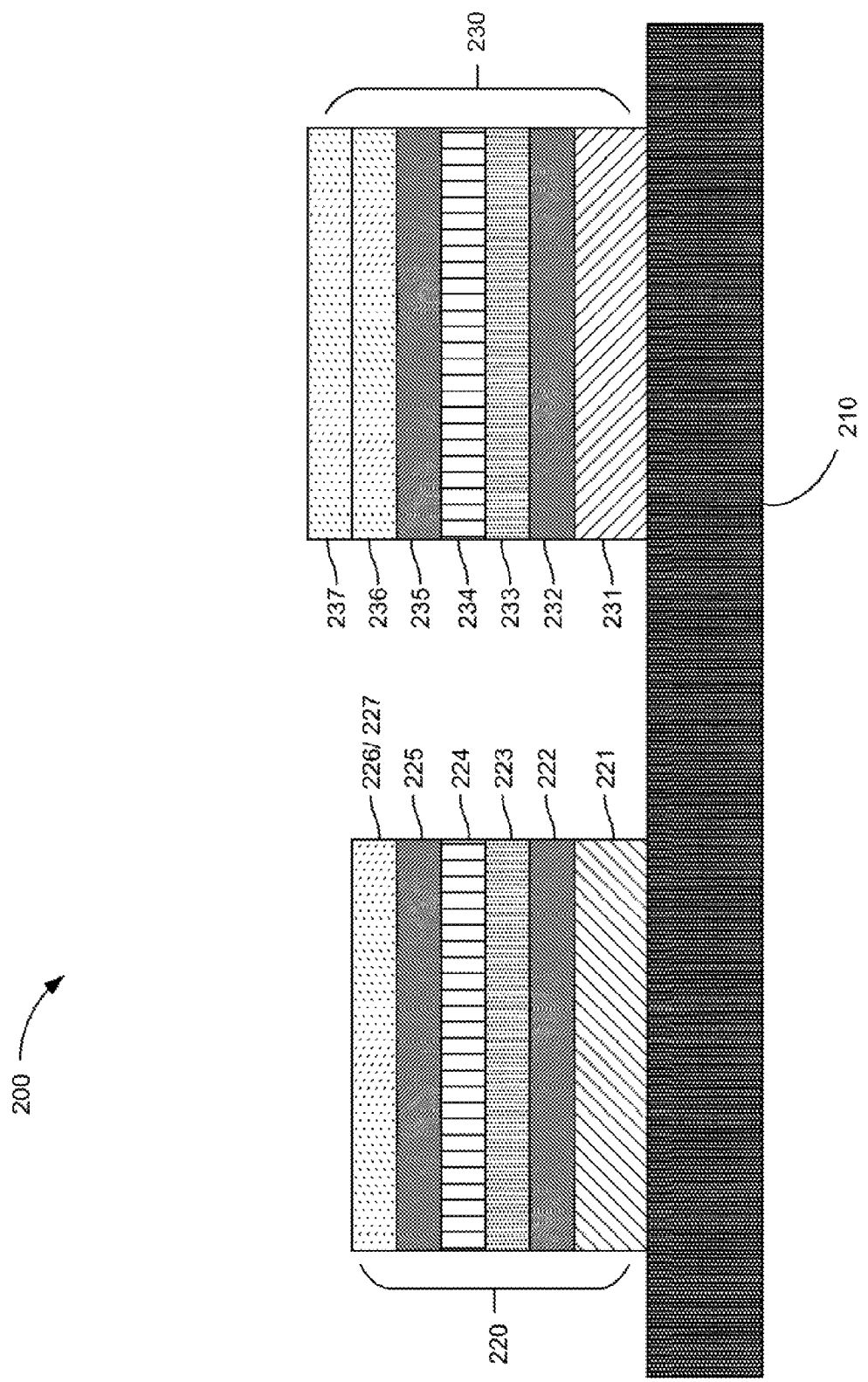
FIG. 2 is a cross-sectional view of example semiconductor devices having contacts that provide low contact resistance for both p-type and n-type materials and the contacts having probing layers and diffusion blocking layers.

FIG. 2 shows a cross-sectional view of a device 200 having a plurality (i.e., two) of semiconductor devices 220 and 230 each having a contact that provide low contact resistance for both p-type and n-type materials and the contacts having probing layers and diffusion blocking layers. Semiconductor devices 220 and 230 may be analogous to device 100 of FIG. 1. Semiconductor devices 220 and 230 may each be a device or system that can be implemented in a variety of computer or network systems, such as optical computing and communications. For example, semiconductor devices 220 and 230 may represent hybrid laser devices or any other types of integrated circuits.

Semiconductor devices 220 and 230 may be coupled on a substrate 210. Substrate 210 may be, for example, a wafer or solid substance onto which other substances are adhered. The substrate 210 may serve as a foundation for microelectronic and photonic devices, and may be the base that electronic and photonic devices are deposited. The substrate may, in some examples, be a thin slice of material, which may include semiconductors such as silicon and germanium, compound semiconductors such as gallium arsenide (GaAs) and indium phosphide (InP), or dielectric insulators such as silicon oxide and aluminum oxide. In some examples, the substrate may include multiple materials, including but not limited to the examples listed above.

Each semiconductor device 220 and 230 may have a semiconductor device layer (221 and 231), respectively. The semiconductor device layers may be the active structures of the respective semiconductor devices. The semiconductor device layers may include a p-type material, an n-type material, or both. Contacts, represented by layers 222-227, may be manufactured on the semiconductor layers 221 and 231 with a complementary metal-oxide-semiconductor (CMOS) process. The contacts may each include a first layer 222/232 coupled with a surface of the respective semiconductor device layer 221/231, a conducting second layer 223/233 coupled with the first layer, a third layer 224/234 coupled with the conducting second layer, a fourth layer 225/235 coupled with the third layer, and a diffusion blocking layer 226/236 and a probing layer 227/237 coupled with the fourth layer.

In some examples, semiconductor device layers 221 and 231 may include a p-type material, an n-type material, or both. An example of a p-type material may be doped p-InGaAs, and an example of an n-type material may be doped n-InP. As a specific example, a waveguide region of a III-V semiconductor material may be manufactured onto a silicon substrate 210 with a CMOS process. Furthermore, semiconductor device layers 221 and 231 may provide various functions for their respective semiconductor device 220/230, including optical signal production, modulation, absorption, transport, etc. Additionally or as an alternative, the semiconductor device layers may behave as an electronic device such as a high speed transistor.

In some examples, each of the contacts may be manufactured on the semiconductor device layers 221 and 231 with a CMOS process. Each contact may provide good adherence to both p-type materials, n-type materials, and, in some examples, to other materials such as oxides. Thus, each contact may serve as an electrical control terminal to control operations of the circuit of device 200. Each contact may include a plurality of layers of different materials and may have a range of thickness. For some examples, a contact may have a thickness greater than 100 nanometers. It should be noted that the thickness of the contacts and their layers may be based on practical limitations of deposition and other fabrication techniques. However, different thicknesses may be possible to the extent that processing techniques are improved.

Each contact may include a first layer 222/232 coupled with a surface of the semiconductor device layer 221/231. First layer 222/232 may be conducting or highly conducting, and may be chemically inert to the surface of the semiconductor device layer 221/231 to which it is coupled. First layer 222/232 may generally be a thin layer, but may have a range of thicknesses. For example, first layer 222/232 may range from several nanometers to several tens of nanometers. As a specific example, each first layer 222/232 may have a thickness of about 10 nanometers. First layer 222/232 may have a highly conducting material such as palladium. In some other examples, first layer 222/232 may include germanium.

Each conducting second layer 223/233 may be coupled with the respective first layer 222/232. Conducting second layer 223/233 may be chemically inert to the first layer 222/232, and generally may be a thin layer. Conducting second layer 223/233 may have a range of thicknesses, such as from several nanometers to tens of nanometers. In one example, conducting second layer 223/233 may have a thickness of about 10 nanometers. Conducting second layer 223/233 may be highly conductive and may reduce the overall contact resistivity of the contact. For example, a contact with a conducting second layer may have a lower contact resistance than an equivalent contact without the conducting second layer. Conducting second layer 223/233 may include a CMOS-compatible material, such as a highly conducting metal like titanium.

Each third layer 224/234 may be coupled with the conducting second layer 223/233. Third layer 224/234 may be conducting or highly conducting, and may be chemically inert to the conducting second layer 223/233. Third layer 224/234 may generally be a thin layer, but may have a range of thicknesses. For example, third layer 224/234 may range from several nanometers to hundreds of nanometers. As a specific example, third layer 224/234 may have a thickness of about 60 nanometers. Third layer 224/234 may a highly conducting material such as germanium. In some other examples, third layer 224/234 may include palladium.

Each fourth layer 225/235 may be coupled with the third layer 224/234. Fourth layer 225/235 may be conducting or highly conducting, and may be chemically inert to the third layer 224/234 to which it is coupled. Fourth layer 225/235 may generally be a thin layer, but may have a range of thicknesses. For example, fourth layer 225/235 may range from several nanometers to several tens of nanometers. As a specific example, each fourth layer 225/235 may have a thickness of about 10 nanometers. Fourth layer 225/235 may have a highly conducting material such as palladium. In some other examples, fourth layer 225/235 may include germanium.

Continuing to refer to FIG. 1, each of the contacts may include additional layers, including a diffusion blocking layer 226/236 coupled with the fourth layer 225/235, and/or a probing layer 227/237 coupled with the diffusion blocking layer. Diffusion blocking layer 226/236 may act as a barrier inhibiting diffusion of materials between layers of the contact and between the contact and other components of device 200. Diffusion blocking layer 226/236 may include various CMOS-compatible materials, such as tungsten and/or titanium. Probing layer 227/237 may allow uniform electrical conduction throughout the entire contact area and may allow a low resistance interface for metal wire bonding or other chip integration. Probing layer 227/237 may include CMOS-compatible materials, such as aluminum. In some examples, such as illustrated with semiconductor device 220, a contact may include a diffusion blocking layer 226 or probing layer 227, while in some other examples, such as shown with semiconductor device 230, a contact may include both a diffusion blocking layer 236 and probing layer 237.

Device 200 and its components may be manufactured on semiconductor using a CMOS process. For example, each of the layers of the semiconductor devices 220 and 230 may be deposited by evaporation or sputtering. In some examples, the process to manufacture the contacts of the semiconductor devices may include a dry-etch technique to form various shapes and designs. Furthermore in some examples, the semiconductor devices and their layers may be annealed after deposition. For example, components may be annealed at 400° C. for 30 seconds (or other temperature and time combinations based on size and dimension).

As described previously, the contacts for the semiconductor devices 220 and 230 may provide low contact resistance for both p-type and n-type materials. For example, the contacts may provide contact resistivity equal to or less than $3 \times 10^{-5}$ Ohm-cm$^2$.

Figure 3:
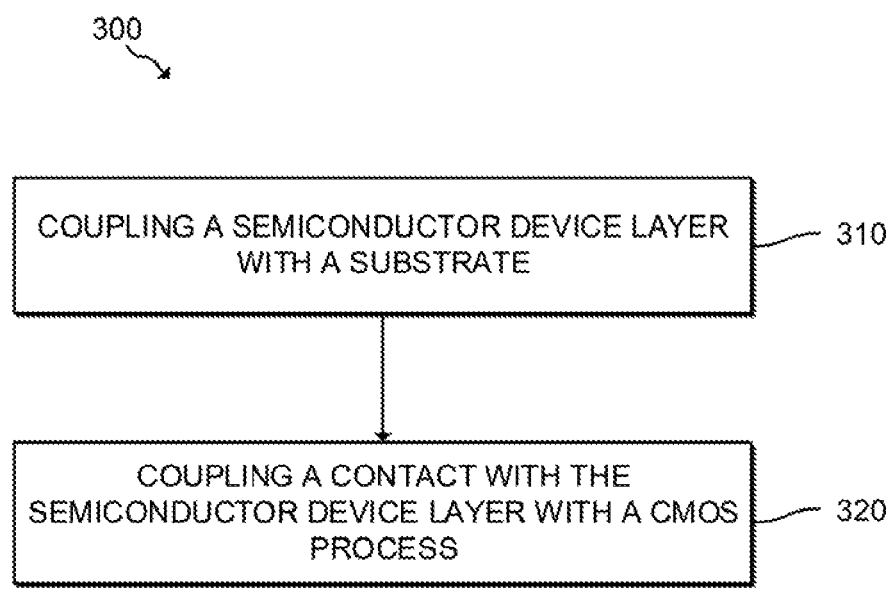
FIG. 3 is a flowchart of an example method for manufacturing a semiconductor device having a contact that provides low contact resistance for both p-type and n-type materials.

FIG. 3 is a flowchart of an example method 300 for manufacturing a semiconductor device having a contact that provides low contact resistance for both p-type and n-type materials. Accordingly, the description of FIG. 3 herein makes references to FIG. 2. However, other suitable candidates for illustration of method 300 should be apparent.

In an operation 310, a semiconductor device layer may be coupled with a substrate. For example in FIG. 2, a semiconductor device layer 221 may be deposited on the substrate 210 by a variety of methods, including wafer bonding, ion beam assisted deposition, sputtering, atomic layer deposition, evaporation, and chemical vapor deposition. As described herein, substrate 210 may serve as a foundation for microelectronic and photonic devices, and may be the base that electronic and photonic devices are deposited. The semiconductor device layer 221 may be the active structures of the semiconductor devices. The semiconductor device layer 221 may include a p-type material, an n-type material, or both.

In an operation 320, a contact may be coupled with the semiconductor device layer with a CMOS-compatible process. For example in FIG. 2, each of the layers of the contact of semiconductor device 220 may be deposited onto semiconductor device layer 221 by sputtering or evaporation. In some examples, the process to manufacture the contacts of the semiconductor devices may include a dry-etch technique to form various shapes and designs. Furthermore in some examples, the semiconductor devices and their layers may be annealed after deposition. For example, components may be annealed at 400° C. for 30 seconds (or other temperature and time combinations based on size and dimension). A contact may provide low contact resistance for both p-type and n-type materials. For example, the contacts may provide contact resistivity equal to or less than $3\times10^{-5}$ Ohm-cm$^2$. Details of contacts is described previously herein in relation to FIG. 1 and FIG. 2.

The foregoing describes a number of examples for semiconductor devices with contacts providing low contact resistance for both p-type and n-type materials. It should be understood that the examples described herein may include additional components and that some of the components described herein may be removed or modified without departing from the scope of the examples or their applications. It should also be understood that the components depicted in the figures are not drawn to scale, and thus, the components may have different relative sizes with respect to each other than as shown in the figures.

Further, the sequence of operations described in connection with FIGS. 1-3 are examples and are not intended to be limiting. Additional or fewer operations or combinations of operations may be used or may vary without departing from the scope of the disclosed examples. Furthermore, implementations consistent with the disclosed examples need not perform the sequence of operations in any particular order. Thus, the present disclosure merely sets forth possible examples of implementations, and many variations and modifications may be made to the described examples. All such modifications and variations are intended to be included within the scope of this disclosure and protected by the following claims.

It should further be noted that, as used in this application and the appended claims, the singular forms "a," "an," and "the" include plural elements unless the context clearly dictates otherwise.

What is claimed is:

1. A semiconductor device, comprising:
a semiconductor device layer comprising at least one of a p-type material or a n-type material;
a contact manufactured on the semiconductor device layer with a complementary metal-oxide-semiconductor (CMOS) process, the contact comprising:
a first layer comprising palladium coupled with a surface of the semiconductor device layer;
a conducting second layer coupled with the first layer; and
a third layer comprising germanium coupled with the conducting second layer, wherein the contact provides a low contact resistance for both p-type and n-type materials;
a fourth layer coupled with a diffusion blocking layer, wherein the contact comprises a probing layer comprising aluminum or copper coupled with the diffusion blocking layer.

2. The semiconductor device of claim 1, wherein the conducting second layer reduces the contact resistance of the contact.

3. The semiconductor device of claim 2, wherein the conducting second layer comprises titanium.

4. The semiconductor device of claim 1, wherein the fourth layer is coupled with the third layer and the fourth layer comprises a highly conductive metal.

5. The semiconductor device of claim 1, wherein the semiconductor device layer comprise an oxide material.

6. The semiconductor device of claim 1, wherein the CMOS process to manufacture the contact on the semiconductor device layer comprises a dry-etch process.

7. The semiconductor device of claim 1, wherein the CMOS process to manufacture the contact on the semiconductor device layer comprises an anneal process.

8. The semiconductor device of claim 1, wherein the contact provides, for both p-type and n-type materials, a contact resistivity equal to or less than $3\times10-5$ Ohm-cm2.

9. A method, comprising:
coupling a semiconductor device layer with a substrate, wherein the semiconductor device layer comprises at least one of a p-type material or a n-type material; and
coupling a contact with the semiconductor device layer with a complementary metal-oxide-semiconductor (CMOS) process, wherein the contact provides a low contact resistance for both p-type and n-type materials, and the contact comprising:
a first layer comprising palladium coupled with a surface of the semiconductor device layer;
a conducting second layer coupled with the first layer, wherein the conducting second layer reduces the contact resistance of the contact;
a third layer comprising germanium coupled with the conducting second layer;
a conducting fourth layer coupled with the third layer;
a diffusion blocking layer comprising at least one of nickel or tungsten coupled with the fourth layer; and
a probing layer comprising aluminum coupled with the diffusion blocking layer.

10. The method of claim 9, wherein the CMOS process to couple the contact with the semiconductor device layer comprises a dry-etch process.

11. The method of claim 9, wherein the first layer of the contact provides, for both p-type and n-type materials, a contact resistivity equal to or less than $3\times10-5$ Ohm-cm2.

12. A semiconductor device, comprising:
a waveguide region of a III-V semiconductor material manufactured onto a silicon substrate with a complementary metal-oxide-semiconductor (CMOS) process, wherein the III-V semiconductor material is at least one of p-type or n-type;
a contact coupled with the waveguide region with a complementary metal-oxide-semiconductor (CMOS) process, wherein the contact provides a low contact resistance for the waveguide region, and the contact comprising:
a first layer comprising palladium coupled with a surface of the waveguide region;
a second conducting layer comprising at least one of tungsten and titanium coupled with the first layer, wherein the second conducting layer reduces the contact resistance of the contact;
a third layer comprising germanium coupled with the second conducting layer;
a fourth layer comprising palladium coupled with the third layer;
a diffusion blocking layer comprising at least one of nickel or tungsten coupled with the fourth layer; and
a probing layer comprising aluminum coupled with the diffusion blocking layer.

13. The semiconductor device of claim 12, wherein the contact provides, for the waveguide region, a contact resistivity equal to or less than $3\times10-5$ Ohm-cm2.

* * * * *